(12) United States Patent
Tiwari et al.

(10) Patent No.: US 11,251,784 B2
(45) Date of Patent: Feb. 15, 2022

(54) PROGRAMMABLE-ON-THE-FLY FRACTIONAL DIVIDER IN ACCORDANCE WITH THIS DISCLOSURE

(71) Applicant: STMicroelectronics International N.V., Geneva (CH)

(72) Inventors: Jeet Narayan Tiwari, Greater Noida (IN); Anand Kumar, Noida (IN); Prashutosh Gupta, Ballia (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/193,532

(22) Filed: Mar. 5, 2021

(65) Prior Publication Data

US 2021/0281254 A1    Sep. 9, 2021

Related U.S. Application Data

(60) Provisional application No. 62/986,915, filed on Mar. 9, 2020.

(51) Int. Cl.
*H03K 5/00* (2006.01)
*H03K 19/20* (2006.01)
*H03L 7/197* (2006.01)

(52) U.S. Cl.
CPC ......... *H03K 5/00006* (2013.01); *H03K 19/20* (2013.01); *H03L 7/1974* (2013.01)

(58) Field of Classification Search
None
See application file for complete search history.

(56) References Cited

U.S. PATENT DOCUMENTS

| | | |
|---|---|---|
| 5,970,110 A | 10/1999 | Li |
| 6,392,455 B1 | 5/2002 | Yarborough, Jr. |
| 2009/0237128 A1 | 9/2009 | Qiao |
| 2011/0140789 A1* | 6/2011 | Kumar ............ H03L 7/1972 331/18 |
| 2015/0071393 A1 | 3/2015 | Wolfer et al. |
| 2017/0373826 A1 | 12/2017 | Travis |

OTHER PUBLICATIONS

Zhang, Mo: "A Programmable Frequency Divider Having a Wide Division Ratio Range, and Close-to-50% Output Duty-Cycle," PhD diss., University of Tennessee, 2007 (124 pages).

* cited by examiner

*Primary Examiner* — Cassandra F Cox
(74) *Attorney, Agent, or Firm* — Crowe & Dunlevy

(57) ABSTRACT

A divider circuit includes a subtract-by-two circuit receiving MSBs of an input and producing a subtracted-by-two output, a subtract-by-one circuit receiving the MSBs and producing a subtracted-by-one output, a first multiplexer passing the subtracted-by-two or the subtracted-by-one output based on a first control signal, a second multiplexer passing output of the first multiplexer or the MSBs based on a second control signal to produce an asynchronous divisor. An asynchronous one-shot N+2 divider divides an input clock by the asynchronous divisor to produce a first divided signal. An output flip-flop receives the first divided signal and is clocked by an inverse of the input clock to produce a second divided signal. A third multiplexer passes the first divided signal or the second divided signal in response to a select load signal to produce a multiplexer output. A divider divides the multiplexer output by a set divisor to produce an output clock.

19 Claims, 8 Drawing Sheets

(Divide by 8)

(Divide by 9)

(Divide by 8.5)

(Divide by 9.5)

PROGRAMMABLE-ON-THE-FLY FRACTIONAL DIVIDER IN ACCORDANCE WITH THIS DISCLOSURE

RELATED APPLICATION

This application claims priority to U.S. Provisional Application for Patent No. 62/986,915, filed Mar. 9, 2020, the contents of which are incorporated by reference in their entirety.

TECHNICAL FIELD

This disclosure is related to the field of clock signal generation and, in particular, is directed to a programmable-on-the-fly fractional divider, such as may be used in a locked loop circuit.

BACKGROUND

Locked loop circuits, such as phase locked loop circuits, are basic components of radio, wireless, and telecommunication technologies. A phase locked loop (PLL) is a control system that generates an output signal having a phase related to the phase of an input signal.

An example PLL includes a variable frequency oscillator, a divider, a phase frequency detector (PFD), a charge pump, and a loop filter. In operation, the VCO generates a VCO output signal as the output of the PLL, and the divider divides the frequency of the VCO output signal to produce a divided signal. The phase frequency detector compares the phase of the divided signal with the phase of an input reference signal, and generates control signals for the charge pump based upon that phase comparison. The charge pump generates a charge pump voltage that, when passed through the loop filter, is used to control the VCO to cause the VCO to adjust the phase and frequency of the VCO output signal so that the divided signal is locked to the input reference signal in frequency and phase. The divided signal being locked to the input reference signal in phase implies that the VCO output signal is locked to the input reference signal in phase. The divided signal being locked to the input reference signal in frequency implies that the frequency of the VCO output signal is equal to the frequency of the input reference signal multiplied by the current divisor value employed by the divider.

Therefore, notice that it is the current divisor value employed by the divider that controls the frequency of the VCO output signal. As a consequence of this, it is desired for the divisor value of the divider to be digitally programmable so that the frequency of the VCO output signal (i.e., the frequency of the output signal produced by the PLL) is selectable.

In some cases, it is desired for the precision provided by the divider in its division to be quite fine, enabling generation of very precise VCO output signals. Therefore, further development into the field of programmable dividers is necessary.

SUMMARY

Disclosed herein is a divider circuit for producing an output clock signal from an input clock signal. The divider circuit includes a subtract-by-two circuit receiving most significant bits of an input divisor value and producing a subtracted-by-two output, the subtracted-by-two output being two less than the most significant bits of the input divisor value. A subtract-by-one circuit receives the most significant bits of the input divisor value and produces a subtracted-by-one output, the subtracted-by-one output being one less than the most significant bits of the input divisor value. A first multiplexer passes a selected one of the subtracted-by-two output and the subtracted-by-one output in response to a first multiplexer control signal. A second multiplexer passes a selected one of an output of the first multiplexer and the most significant bits of the input divisor value in response to a second multiplexer control signal to thereby produce an asynchronous divider value. An asynchronous one shot N+2 divider receives the asynchronous divider value and the input clock signal, the asynchronous one shot N+2 divider configured to divide the input clock signal by the asynchronous divider value to produce a first divided signal. An output flip flop receives the first divided signal, the output flip flop being clocked by an inverse of the input clock signal to produce a second divided signal. A third multiplexer passes a selected one of the first divided signal and the second divided signal in response to a select load signal to thereby produce a multiplexer output clock. A divider receives the multiplexer output clock and divides the multiplexer output clock by a set divisor to produce the output clock signal.

An input flip flop may receive the input divisor value and a fractional divide indicator, the input flip flop being clocked by an inverse of the output clock signal to latch the input divisor value and the fractional divide indicator.

The divider may be a divide by two divider that divides the multiplexer output clock by two to produce the output clock signal.

A first combinational logic circuit may be configured to generate the first multiplexer control signal based upon a least significant bit of the input divisor value, a fractional divide indicator, an inverse of the output clock signal, and the select load signal.

The first combinational logic circuit may also be configured to generate the second multiplexer control signal based upon the least significant bit of the input divisor value, the fractional divide indicator, the inverse of the output clock signal, and the select load signal.

A first inverter may be configured to receive the output clock signal and produce the inverse of the output clock signal. A second inverter may be configured to receive the inverse of the output clock signal and produce a reproduced version of the output clock signal. The first combinational logic circuit may include a third inverter receiving the least significant bit of the input divisor value and outputting an inverse of the least significant bit of the input divisor value, a first NAND gate receiving the least significant bit of the input divisor value and the inverse of the output clock signal and producing a first NAND output, and a second NAND gate receiving the reproduced version of the output clock signal at an inverting input and receiving the select load signal and the fractional divide indicator at non-inverting inputs, the second NAND gate producing a second NAND output. A third NAND gate may receive the first and second NAND outputs and producing the first multiplexer control signal. A NOR gate may receive the inverse of the least significant bit of the input divisor value and the second NAND output and producing the second multiplexer control signal.

A first inverter may be configured to receive the output clock signal and produce the inverse of the output clock signal. A second inverter may be configured to receive the inverse of the output clock signal and produce a reproduced version of the output clock signal. The second combinational logic circuit may include an exclusive OR gate receiving the fractional divide indicator and an immediately prior version of the select load signal, and an AND gate receiving the inverse of the input clock, the first divided signal, and the second divided signal, and producing a clock phase select signal. A first flip flop may receive the reproduced version of the output clock signal and being clocked by the clock phase select signal to produce a phase select signal. A second flip flop may receive output of the exclusive OR gate and be clocked by the phase select signal to produce the select load signal.

DETAILED DESCRIPTION

Figure 1:
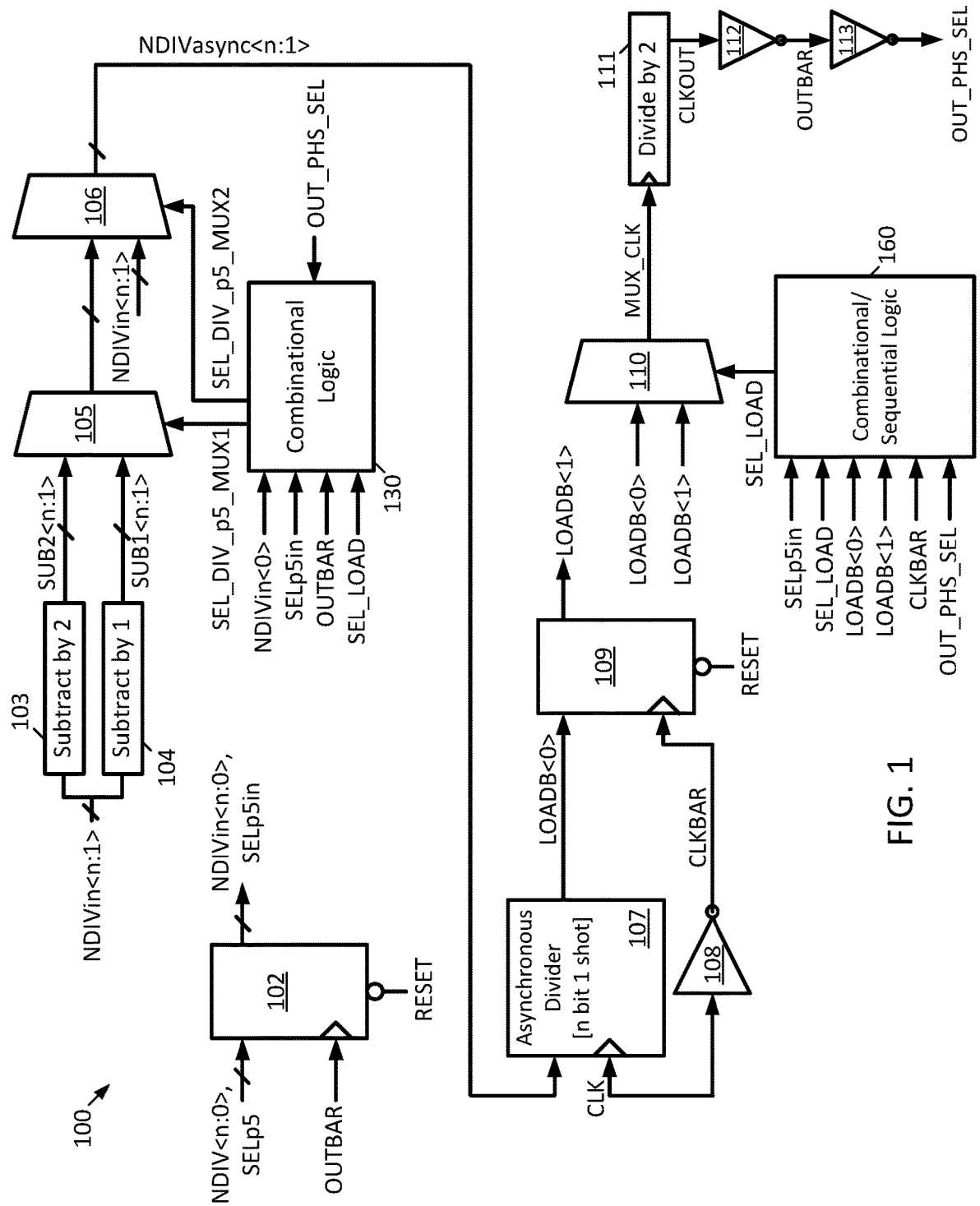
FIG. 1 is a simplified block diagram of a programmable-on-the-fly fractional divider in accordance with this disclosure.

First, the structure and functionality of a programmable-on-the-fly fractional divider 100 is described with reference to FIG. 1, and thereafter, more specific implementation details and usage examples will be described.

A. General Structure

The programmable-on-the-fly fractional divider 100 includes a flip flop 102 serving as input to the divider. The flip flop 102 receives the divisor value NDIV<n:0> and the fractional divide selection value SELp5 as input, and is clocked by the OUTBAR signal (which is an inverted version of the output clock CLKOUT produced by the programmable-on-the-fly fractional divider 100) to latch NDIV<n:0> to its output as NDIVin<n:0>, and to latch SELp5 to its output as SELp5in. The flip flop 102 may be reset by the reset signal RESET.

NDIVin<n:1> (therefore, the N−1 most significant bits of NDIV<n:0>) is received by a subtract-by-two circuit 103, which subtracts two from NDIVin<n:1> to produce SUB2<n:1>. NDIVin<n:1> is also received by a subtract-by-one circuit 104, which subtracts one from NDIVin<n:1> to produce SUB1<n:1>.

A multiplexer 105 receives SUB2<n:1> and SUB1<n:1> and passes one of them as its output, dependent upon the SEL_DIVp5_MUX1 signal. Note that when SEL_DIVp5_MUX1 is at logic 0, SUB2<n:1> is passed as the output of the multiplexer 105, but when SEL_DIVp5_MUX1 is at logic 1, SUB1<n:1> is passed as the output of the multiplexer 105.

A multiplexer 106 receives the output of the multiplexer 105, as well as NDIVin<n:1>, and passes one of them as its output NDIVasync<n:1>, dependent upon the SEL_DIVp5_MUX2 signal. Note that when SEL_DIVp5_MUX2 is at logic 0, the output of the multiplexer 105 is passed as NDIVasync<n:1>, but when SEL_DIVp5_MUX2 is at logic 1, NDIVin<n:1> is passed as NDIVasync<n:1>.

SEL_DIVp5_MUX1 and SEL_DIVp5_MUX2 are generated by the combinational logic 130 based upon the values of NDIVin<0> (the least significant bit of NDIVin<n:0>), SELp5in, OUTBAR, and the SEL_LOAD signal (a selection load signal generated by combinational logic 160, described below).

An asynchronous n-bit one shot N+2 divider 107 receives the NDIVasync<n:1> signal as input, and divides a received clock signal CLK by NDIVasync<n:1> to produce LOADB<0> in one shot form.

The clock signal CLK is inverted by inverter 108 to produce the CLKBAR signal.

A flip flop 109 receives LOADB<0> as input and latches it to its output as LOADB<1> when clocked by the CLKBAR signal. The flip flop 109 is reset by the reset signal RESET.

A multiplexer 110 receives the LOADB<0> and LOADB<1> signals, and passes one of them as its output MUX_CLK, dependent upon the SEL_LOAD signal. Note that when SEL_LOAD is at logic 0, LOADB<0> passed as MUX_LK, but when SEL_OAD is at logic 1 LOADB<0> is passed as MUX_CLK.

The SEL_LOAD signal (a new value of SEL_LOAD) is generated by the combinational/sequential logic circuit 160 based upon the values of SELp5in, SEL_LOAD (the prior value of SEL_LOAD), LOADB<0>, LOADB<1>, and CLKBAR.

A divide-by-2 circuit 111 receives the MUX_CLK signal as output and divides it by 2 to produce the output clock signal CLKOUT.

An inverter 112 inverts CLKOUT to produce the OUTBAR signal, and an inverter 113 inverts the OUTBAR signal to produce the OUT_PHS_SEL signal.

B. General Operation

Operation of the divider 100, in general, is as follows. The flip flop 102 receives the divider value NDIV<n:0>, as well as the fractional divide selection signal SELp5 (which is the fractional portion of the divider value, if any), and is clocked on the rising edge of OUTBAR (e.g., when the output clock CLKOUT transitions low) so as to permit changing of the divider value NDIV<n:0> on a per-cycle basis. The flip flop 102 outputs NDIVin<n:0> and SELp5in on the rising edge of OUTBAR so that the new divider value NDIV<n:0> will be loaded before the rising edge of the output clock CLKOUT.

Note that the asynchronous divider 107 is an n-bit 1 shot N+2 divider. Therefore, the combinational logic circuit 130 uses the divider value NDIVin<n:0> (the latched value of NDIV<n:0>), the fractional divide selection signal SELp5in (the latched value of SELp5), the complement of the output clock signal CLKOUT (labeled as OUTBAR), the complement of OUTBAR (labeled as OUT_PHS_SEL), and the select load signal SEL_LOAD to generate control signal SEL_DIVp5_MUX1 to select whether the multiplexer 105 passes SUB2<n:1> (equal to NDIVin<n:1> minus two) or SUB1<n:1> (equal to NDIVin<n:1> minus one) as its output. In addition, the combinational logic circuit 130 uses its input signals to generate control signal SEL_DIVp5_MUX2 for the multiplexer 106 to determine whether the output of the multiplexer 105 is to be passed as the output of the multiplexer 106, or whether NDIVin<n:1> is to be passed as the output of the multiplexer 106. The output of the multiplexer 106 is an asynchronous divider value NDIVasync<n:1> to be fed to the asynchronous divider 107.

The asynchronous divider 107 outputs LOADB<0> as the input clock CLK divided by NDIVasync<n:1>, in 1-bit 1 shot form. The flip flop 109 latches LOADB<0> on the falling edge of the input clock CLK (labeled as CLKBAR) to produce LOADB<1>, a phase shifted version of LOADB<0>.

The combinational/sequential logic circuit 160 uses the fractional divide selection signal SELp5in, the previous version of the select load signal SEL_LOAD, OUT_PHS_SEL, CLKBAR, LOADB<0>, and LOADB<1> to generate the current version of the select load signal SEL_LOAD, which controls the multiplexer 110 to generate MUX_CLK as being either LOADB<0> or LOADB<1>. MUX_CLK is divided by 2 by the divider 111 to produce the final output clock CLKOUT, which has a frequency equal to CLK divided by (NDIV<n:0>+SELp5) and has a 50% duty cycle.

C. Specific Implementation Details of Combinational Logic Circuit 130 and Combinational/Sequential Logic Circuit 160

Figure 3:
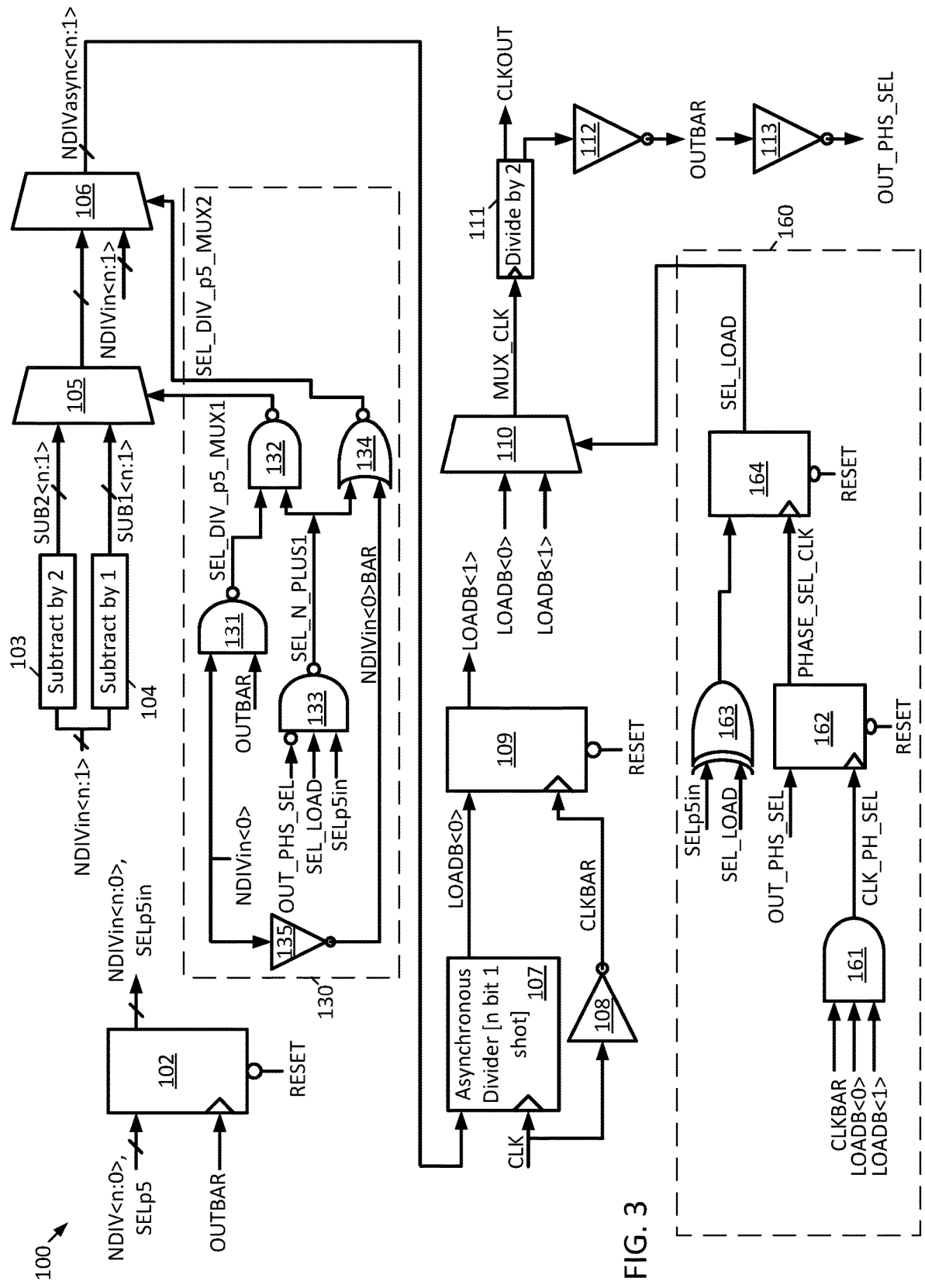
FIG. 3 is a more detailed block diagram of the programmable-on-the-fly fractional divider of FIG. 1.

Referring now to FIG. 3, note that the specifics of the combinational logic circuit 130 and combinational/sequential logic circuit 160 are shown, but the divider 100 is otherwise the same.

The combinational logic circuit 130 includes a NAND gate 133 receiving as input an inverted version of the OUT_PHS_SEL signal, the SEL_LOAD signal, and the SELp5in signal, and providing its output as the SEL_N_PLUS1 signal. A NAND gate 131 receives as input the NDIVin<0> signal, as well as the OUTBAR signal, and provides its output to the NAND gate 132. The NAND gate 132 receives the output of the NAND gate 131 as input, as well as the SEL_N_PLUS1 signal, and generates the SEL_DIVp5_MUX1 signal as a result of performing a logical NAND operation on the output of the NAND gate 131 and the SEL_N_PLUS1 signal. NDIVin<0> is inverted by the inverter 135 to produce the NDIVin<0>BAR signal. The NOR gate 134 receives SEL_N_PLUS1 and NDIVin<0>BAR as input, and generates the SEL_DIVp5_MUX2 signal as a result of performing a logical NOR operation on SEL_N_PLUS1 and NDIVin<0>BAR.

The combinational/sequential logic circuit 160 includes an AND gate 161 receiving the CLKBAR signal, the LOADB<0> signal, and the LOADB<1> as input, and providing its output as the CLK_PH_SEL signal. A flip flop 162 receives the OUT_PHS_SEL as input, and is clocked by the CLK_PH_SEL signal. The flip flop 162 latches OUT_PHS_SEL as the PHASE_SEL_CLK signal when clocked. The flip flop 162 is reset by the reset signal RESET. An exclusive OR (XOR) gate 163 receives the SELp5in and SEL_LOAD (old value) signals as input, and provides its output to a flip flop 164. The flip flop 164 receives the output of the XOR gate 163 as input, and is clocked by the PHASE_SEL_CLK signal. The flip flop 164 latches the output of the XOR gate 163 as the SEL_LOAD signal when clocked by PHASE_SEL_CLK. The flip flop 164 is reset by the reset signal RESET.

D. Explanation of Operation of Asynchronous Divider

Figure 2:
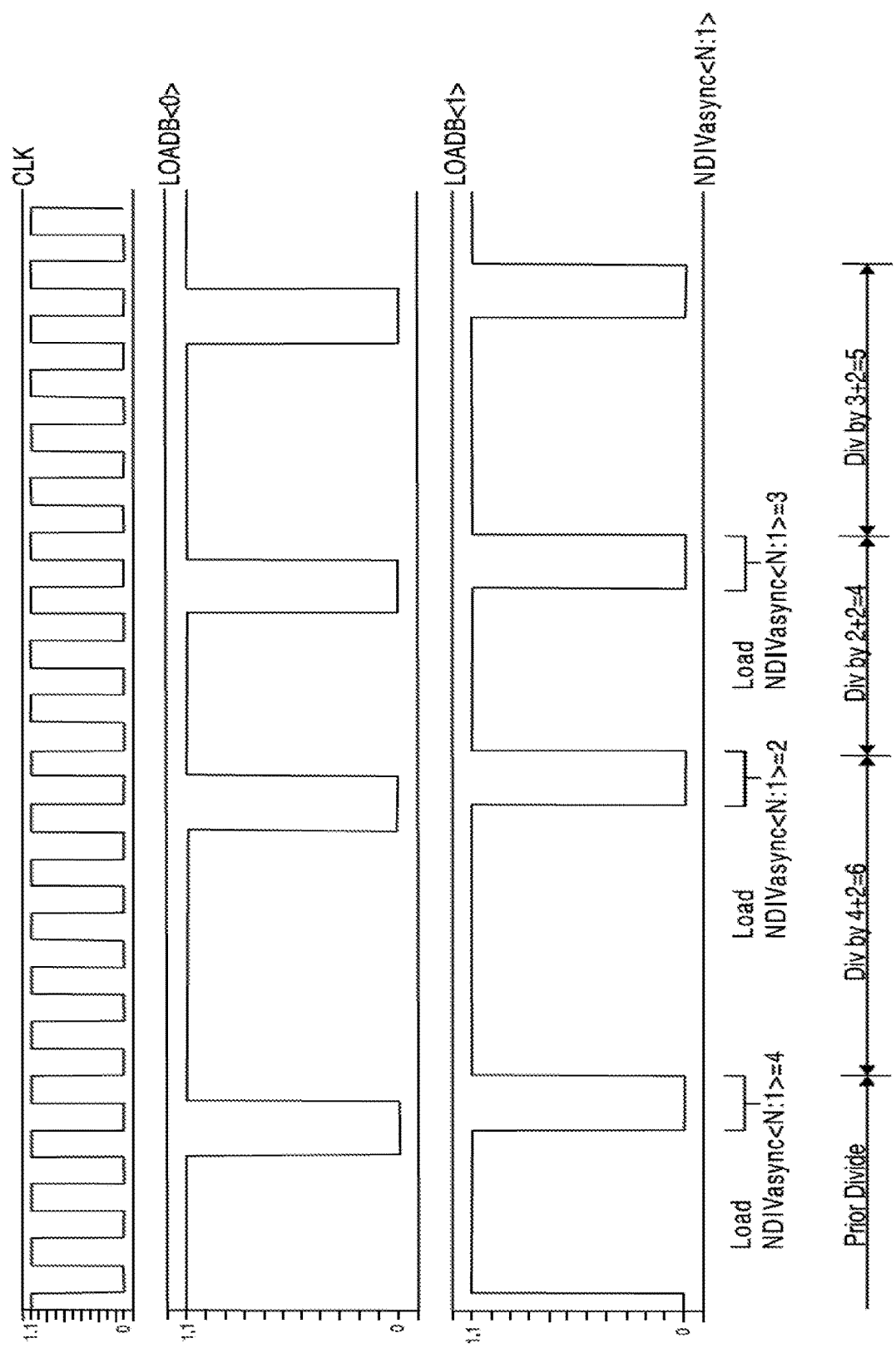
FIG. 2 is a timing diagram illustrating operation of the asynchronous n-bit one shot N+2 divider of FIG. 1.

The asynchronous divider 107 is an n-bit 1 shot N+2 asynchronous divider. Prior to continuing with the specific examples of even integer, odd integer, even fractional, and odd fractional divides, the operation of the asynchronous divider 107 is now described with reference to FIG. 2.

After output of the asynchronous divider 107 (which is LOADB<0>) transitions low at the end of a divide cycle, the asynchronous divider 107 is loaded with the latest value of NDIVasync<n:1>. Since the asynchronous divider 107 is a N+2 divider, loading the asynchronous divider 107 with NDIVasync<n:1> causes the next divide cycle to be a divide of CLK by NDIVasync<n:1>+2.

Examples of changing divides will now be given. Note that, starting at time 0, once LOADB<0> transitions low to complete the prior divide cycle, the asynchronous divider 107 is loaded with NDIVasync<n:1>=4, and then the next divide begins at the next rising edge of CLK when LOAB<0> transitions high. Since the asynchronous divider 107 is a N+2 divider, loading the asynchronous divider 107 with NDIVasync<n:1>=4 produces a divide by 6. Therefore, this divide cycle shown is a divide of CLK by 6.

Now, once LOADB<0> transitions low to complete the divide by 6 cycle, the asynchronous divider 107 is loaded with NDIVasync<n:1>=2, and then the next divide begins at the next rising edge of CLK when LOAB<0> transitions high. Since the asynchronous divider 107 is an N+2 divider, loading the asynchronous divider 107 with NDIVasync<n:1>=2 produces a divide by 4. Therefore, this divide cycle shown is a divide of CLK by 4.

Now, once LOAB<0> transitions low to complete the divide by 4 cycle, the asynchronous divider 107 is loaded with NDIVasync<n:1>=3, and then the next divide begins at the next rising edge of CLK when LOAB<0> transitions high. Since the asynchronous divider 107 is a N+2 divider, loading the asynchronous divider 107 with NDIVasync<n:1>=3 produces a divide by 5. Therefore, this divide cycle shown is a divide of CLK by 5.

E. Even Integer Divide Explanation

Figure 4A:
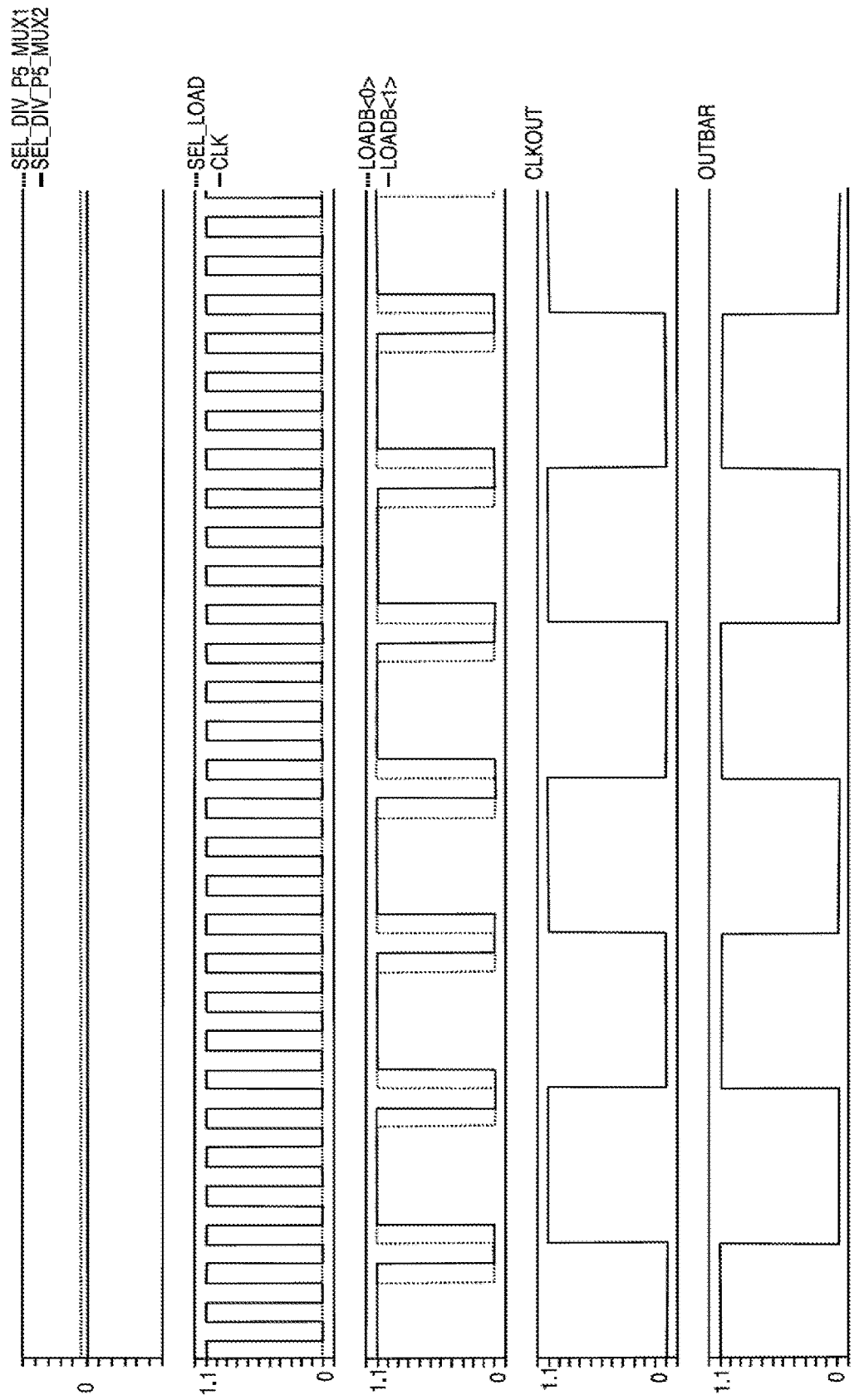
FIG. 4A is a timing diagram of the programmable-on-the-fly fractional divider of FIG. 3 in operation when performing an even integer divide.

Refer now to FIGS. 3 and 4A. Where NDIV<n:0> is an even integer (meaning that NDIV<0> is at logic 0 and that the factional divide selection signal SELp5 is also at logic 0), the combinational logic circuit 130 outputs SEL_DIVp5_MUX1 as a logic 0 to thereby select SUB2<n:1> for passage through the multiplexer 105, and the combinational logic circuit 130 outputs SEL_DIVp5_MUX2 as a logic 0 to select the output of the multiplexer 105 for output by the multiplexer 106 as asynchronous divider value NDIVasync<n:1>.

Assuming the starting (previous) condition of SEL_LOAD to be 0, the combinational/sequential logic circuit 160 continues to output SEL_LOAD as 0 to thereby select LOADB<0> for passage through the multiplexer 110 as MUX_CLK, for division by 2 by the divider 111 to produce CLKOUT.

Assuming the starting (previous) condition of SEL_LOAD to be 1, the combinational/sequential logic circuit 160 continues to output SEL_LOAD as 1 to thereby select LOADB<1> for passage through the multiplexer 110 as MUX_CLK, for division by 2 by the divider to produce CLKOUT.

As an example, consider the case where NDIV<n:0>=8, and therefore NDIVin<n:1>=4, NDIVin<0>=0, and SELp5in=0. Referring to the combinational logic 130, as a result the output of NAND gates 131 and 133 will both be 1, and consequently, the output of NAND gate 132 (SEL_DIVp5_MUX1) will be 0 while the output of NOR gate 134 (SEL_DIV_p5_MUX2) will be 0. This causes SUB2<n:1> to be passed as NDIVasync<n:1> to the asynchronous divider 107. Due to NDIVin<0> being 0, the output of NAND gate 131 does not toggle with OUTBAR, so SEL_DIVp5_MUX1 remains a 0 throughout the divide by 8 operation. This can be seen in FIG. 4A, where it is observed that SEL_DIVp5_MUX1 and SEL_DIVp5_MUX2 both remain low throughout the divide by 8 operation.

As a result, each divide performed by the asynchronous divider 107 will be of SUB2<n:1> (with the result being that CLK is divided by 4, since the divider is a N+2 divider) to produce LOADB<0>. As shown in FIG. 4A, LOADB<0> and LOAB<1> each have a period equal to 4× the period of CLK.

Since SEL_LOAD will not toggle high due to SELp5in being 0, as shown in FIG. 4A, either LOADB<0> or LOADB<1> will be continually passed through the multiplexer 110 as MUX_CLK, for division by 2 by the divider 111 to produce CLKOUT as being equal to CLK/8. Indeed, as shown in FIG. 4A, CLKOUT and OUTBAR each have a period equal to 8× the period of CLK.

Therefore, as described and illustrated in FIG. 4A, when NDIV<n:0>=8 and SELp5=0, the divider 100 generates CLKOUT as being CLK divided by 8 (e.g., CLKOUT having a period equal to 8× the period of CLK).

F. Odd Integer Divide Explanation

Where NDIV<n:0> is an odd integer (meaning that NDIV<0> is at logic 1 and that the factional divide selection signal SELp5 is also at logic 0), the combinational logic circuit 130 outputs SEL_DIVp5_MUX1 as toggling between logic 0 and logic 1 as the falling edges of CLKOUT, thereby toggling between selecting SUB2<n:1> and SUB1<n:1> for passage through the multiplexer 105. The combinational logic circuit 130 outputs SEL_DIVp5_MUX2 as a logic 0 to select the output of the multiplexer 105 for output by the multiplexer 106 as asynchronous divider value NDIVasync<n:1>.

As an example, consider the case where NDIV<n:0>=9, and therefore NDIVin<n:1>=4, NDIVin<0>=1, and SELp5in=0. Referring to the combinational logic 130, assuming that CLKOUT starts at a logic 1 (so OUTBAR is a logic 0), the NAND gate 131 will output a logic 1, and the NAND gate 133 will output a logic 1, and consequently, the output of NAND gate 132 (SEL_DIVp5_MUX1) will be at logic 0 while the output of NOR gate 134 (SEL_DIVp5_MUX2) will be at logic 0. This can be seen in FIG. 4B, where it can be observed that SEL_DIVp5_MUX1 transitions low when CLKOUT initially transitions high (OUTBAR transitions low), while SEL_DIVp5_MUX2 remains low throughout.

Figure 4B:
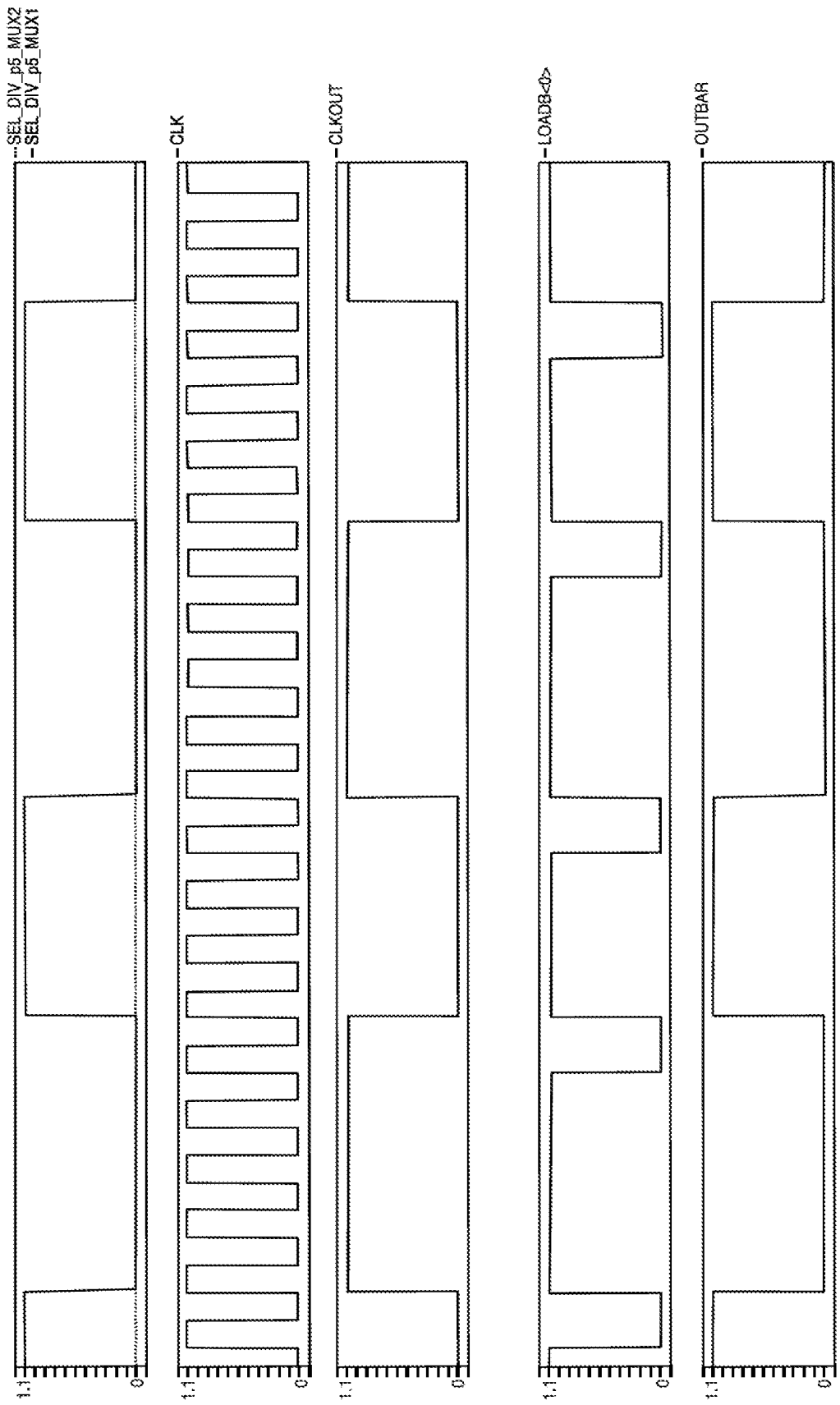
FIG. 4B is a timing diagram of the programmable-on-the-fly fractional divider of FIG. 3 in operation when performing an odd integer divide.

This causes SUB2<n:1> to be passed as NDIVasync<n:1> to the asynchronous divider 107, which therefore performs a divide by 4 in the next cycle. This can be seen in FIG. 4B, where LOADB<0> in the next cycle is both equal to CLK/4, that is to say, has a period equal to 4× the period of CLK. Since SEL_LOAD will not toggle due to SELp5in being logic 0 (because the output of XOR gate 163 will not change state), either LOADB<0> or LOADB<1> will be continually passed through the multiplexer 110 as MUX_CLK, for division by 2 by the divider 111 to produce CLKOUT as being low during this cycle for a period of time equal to the period of LOAB<0> or LOAB<1>, as shown in FIG. 4B. Stated another way, here, CLKOUT is low for a period time equal to 4× the period of CLK.

When CLKOUT transitions to a logic 0 (so OUTBAR is a logic 1), the NAND gate 131 will output a logic 0, and the NAND gate 133 will output a logic 1, with the result being that the output of the NAND gate 132 (SEL_DIVp5_MUX1) will output a logic 1, causing SUB1<n:1> to be passed as NDIVasync<n:1> to the asynchronous divider 107, which therefore performs a divide by 5 in the next cycle, for division by 2 by the divider 111 to produce CLKOUT during the next cycle as being high for a period of time equal to a period of LOADB<0> or LOADB<1>, as shown in FIG. 4B. Stated another way, here, CLKOUT is high for a period of time equal to 5× the period of CLK.

As explained, CLKOUT is here produced as being high for a period of time equal to 5× the period of clock and as being low for a period of time equal to 4× the period of clock. Therefore, CLKOUT as produced has a period equal to 9× the period of clock, and is therefore equal to CLKOUT/9.

G. Even Fractional Divide

Consider now the case of even fractional divides.

Consider the case where NDIV<n:0> is an even fraction (meaning that NDIV<0> is at logic 0, and the factional divide selection signal SELp5 is also at logic 1 to indicate an additional divide by one half). At a next rising edge of PHASE_SEL_CLK, which comes when CLKBAR, LOADB<0>, and LOAB<1> are all high, a new value of SEL_LOAD is output by the flip flop 164. Let us say that the previous value of SEL_LOAD was logic 0, and therefore, at the rising edge of PHASE_SEL, SEL_LOAD transitions high. This can be seen in FIG. 4C, where at CLK is low (CLKBAR is high), LOADB<0>, and LOAB<1> are all high at the first illustration of SEL_LOAD transitioning from low to high.

Figure 4C:
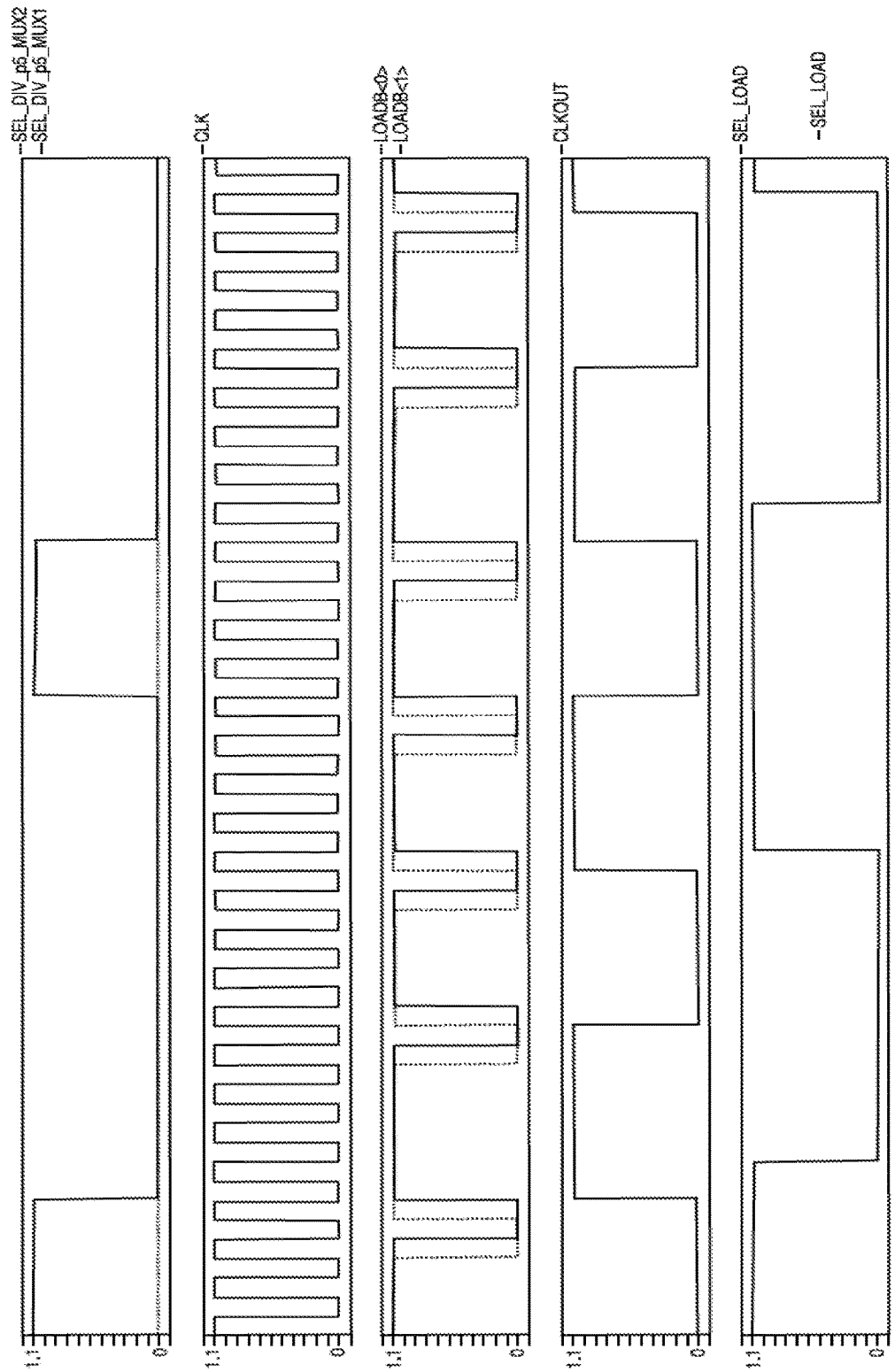
FIG. 4C is a timing diagram of the programmable-on-the-fly fractional divider of FIG. 3 in operation when performing an even fractional divide.

When SEL_LOAD was previously logic 0, the combinational logic circuit 130 outputs SEL_DIVp5_MUX1 as a logic 0 to select SUB2<n:1> for passage through the multiplexer 105, and the combinational logic circuit 130 outputs SEL_DIVp5_MUX2 as a logic 0 to select the output of the multiplexer 105 for output by the multiplexer 106 as asynchronous divider value NDIVasync<n:1>, as both shown in FIG. 4C. NDIVasync<n:1>=NDIVin<n:1>−2 was therefore already loaded into the asynchronous divider 107 at the first illustration of SEL_LOAD transitioning from low to high.

Since SEL_LOAD does not transition high until CLKBAR is high (CLK is low), this means that, as can be observed in FIG. 4C, the asynchronous divider 7 begins outputting LOADB<0> prior to the first illustration of SEL_LOAD transitioning from low to high.

A result of SEL_LOAD rising to logic 1 is that the multiplexer 100 will output LOADB<1> as MUX_CLK, for division by 2 by the divider 111 to produce CLKOUT. The switch from passing LOADB<0> to passing LOAB<1> as output has the effect of adding an additional half cycle of the input clock CLK to the period of CLKOUT, and therefore CLKOUT will be high for a period equal to (NDIVin<n:1>+0.5) multiplied by the period of CLK.

Now, as can be observed in FIG. 4C, SEL_LOAD changing state to a logic 1 also has the effect of causing the combinational logic 130 to output SEL_DIVp5_MUX1 as a logic 0 when CLKOUT=1 and SELp5in=1, to thereby select SUB2<n:1> for passage through the multiplexer 105, while the combinational logic circuit 130 continues to SEL_DIVp5_MUX2 as a logic 0 to select the output of the multiplexer 105 for output by the multiplexer 106 as asynchronous divider value NDIVasync<n:1>. This has the effect of loading this new value of NDIVasync<n:1>=NDIVin<n:1>−1 into the asynchronous divider 107 for the next cycle.

Therefore, at the next rising edge of PHASE_SEL_CLK, SEL_LOAD will change state back to a logic 0, with the result being that the multiplexer 100 will return to outputting LOADB<0> as MUX_CLK, for division by 2 by the divider to produce CLKOUT. Therefore, CLKOUT will be low for a period equal to NDIV<n:1> multiplied by the period of CLK.

As an example, consider the case where the desired divisor is 8.5. Therefore, NDIV<n:0>=8, and NDIVin<n:1>=4, NDIVin<0>=0, and SELp5in=1. At the rising edge of PHASE_SEL_CLK when SEL_LOAD rises to logic 1, the asynchronous divider 107 will have already been loaded with NDIVasync<n:1>=4, and due to the selection of LOADB<1> by the multiplexer 110, CLKOUT will be high for a period equal to (NDIVin<n:1>+0.5)=4.5 multiplied by the period of CLK.

As also explained, the asynchronous divider 107 will be loaded with NDIVasync<n:1>=4−1=3 during the PHASE_SEL_CLK period in which SEL_LOAD rises to logic 1. Therefore, at this point, SEL_LOAD will fall to a logic 0, and since the asynchronous divider 107 will have already been loaded with NDIVin<n:1>−1=4−1=3, CLKOUT will be high for a period equal to (NDIV<n:1>+1) multiplied by the period of CLK.

Since CLKOUT will be high for a period of time equal to 4.5 multiplied by the period of CLK and will be low for a period of time equal to 4 multiplied by the period of CLK, CLKOUT will be equal to CLK/8.5.

H. Odd Fractional Divide

Consider the case where NDIV<n:0> is an odd fraction (meaning that NDIV<0> is at logic 1, and the factional divide selection signal SELp5 is also at logic 1 to indicate an additional divide by one half). Let us begin at the first illustrated rising edge of CLKOUT.

Figure 4D:
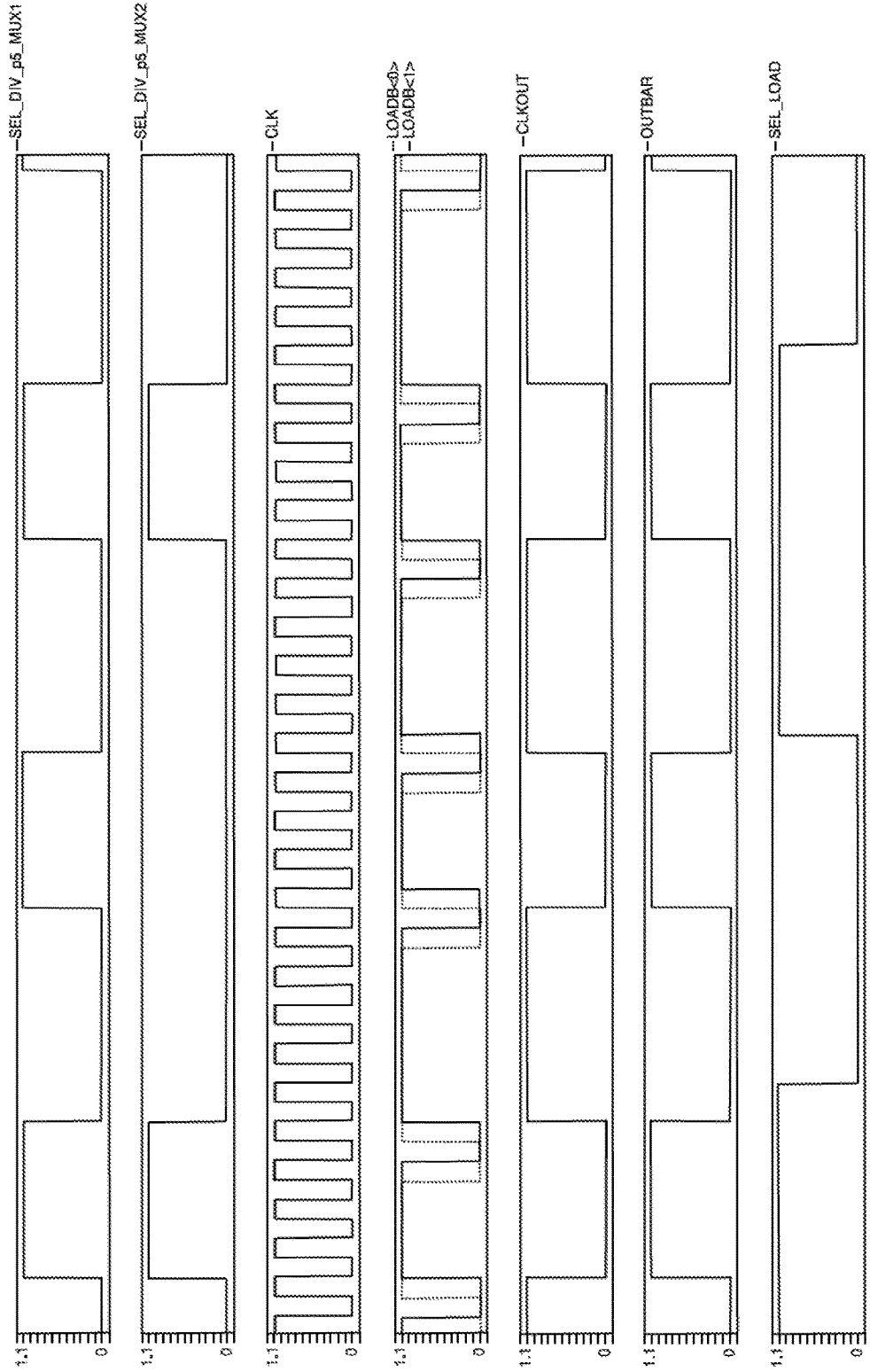
FIG. 4D is a timing diagram of the programmable-on-the-fly fractional divider of FIG. 3 in operation when performing an odd fractional divide.

At the first illustrated rising edge of CLKOUT, SEL_LOAD is high. Since SEL_LOAD was high, and since OUT_PHS_SEL was low prior to the first illustrated rising edge of CLKOUT, this means that NAND gate 133 would have output a 0, and since NDIVin<0>=1, this means that NOR gate 134 would have output at logic 1. The result is that SEL_DIVp5_MUX2 would have been a logic 1, selecting NDIVin<n:1> for output as NDIVasync<n:1>, as can be seen in FIG. 4D.

As such, at the illustrated first rising edge of CLKOUT, the asynchronous divider 107 had already been loaded with NDIVasync<n:1>=NDIVin<n:1>. Therefore, the asynchronous divider 107 had already begun to output LOADB<0> as being CLK/(NDIVin<n:1>+2), and since SEL_LOAD is high, LOADB<1> is originally output as MUX_CLK for division by two by the divider 111 to produce CLKOUT. However, at the first falling edge of CLK (rising edge of CLKBAR) after the illustrated first rising edge of CLKOUT, LOADB<0> and LOAB<1> are also high, meaning that CLK_PH_SEL is high. This clocks the flip flop 162, and since SELp5in and SEL_LOAD (prior value) are both high at this point, SEL_LOAD toggles and is latched as low. This causes the multiplexer 110 to select LOADB<0> for passage as MUX_CLK, which has the effect of subtracting a half period of CLK from CLKOUT. Therefore, CLKOUT is produced as being high for a period of time equal to NDIVin<n:1>+2−0.5, as can be seen in FIG. 4D.

Another effect of SEL_LOAD being low is that the NOR gate 133 will output a logic 1, and NAND gate 131 will also output a logic 1 because NDIVin<0>=1 and OUTBAR=0 (due to CLKOUT being high), such that NAND gate 132 will output a logic 0 and NOR gate 134 will output a logic 0. As a result, SEL_DIVp5_MUX1 and SEL_DIVp5_MUX2 will both be logic 0, selecting NDIVasync<n:1>=NDIVin<n:1>−2 for loading into the divider 107 at the next rising edge of CLK after LOADB<0> or LOADB<1> goes low, as can be seen in FIG. 4D.

Therefore, LOADB<0> will be output as CLK/NDIVin<n:0>, and since SEL_LOAD is low, LOADB<0> will be passed as MUX_CLK and divided by 2 to produce CLKOUT. Therefore, CLKOUT is produced as being low for a period of time equal to NDIVin<n:1>, as can be seen in FIG. 4D.

As an example, consider the case where the desired divisor is 9.5. Therefore, NDIV<n:0>=9, and therefore NDIVin<n:1>=4, NDIVin<0>=1, and SELp5in=1. Assuming that CLKOUT was initally low, SEL_LOAD was initially high, and OUT_PHS_SEL was initially low, NDIVin<n:1>=4 would have been passed as NDIVasync<n:1>, and the asynchronous divider 107 would have been loaded with NDIVasync<n:1>=4. At the first falling edge of CLK after the first rising edge of CLKOUT, OUT_PHS_SEL would rise, toggling SEL_LOAD to be logic 0, subtracting one half period of CLK from CLKOUT. As a result, CLKOUT would be high for a period of time equal to the period of CLK multiplied by NDIVin<n:1>+2−0.5=4+2−0.5=5.5, as can be seen in FIG. 4D.

As explained, the asynchronous divider 107 will be loaded with NDIVasync<n:1>=NDIVin<n:1>−2=4−2=2 at the next rising edge of CLK after LOADB<0> or LOADB<1> goes low. Therefore, CLKOUT would be low for a period of time equal to the period of CLK multiplied by NDIVin<n:1>=4, as can be seen in FIG. 4D.

Overall, since CLKOUT would be high for a period of time equal to the period of CLK multiplied by 5.5, and would be low for a period of time equal to the period of CLK multiplied by 4, an overall divide of 9.5 is performed. Therefore, CLKOUT is equal to CLK/9.5.

Figure 5:
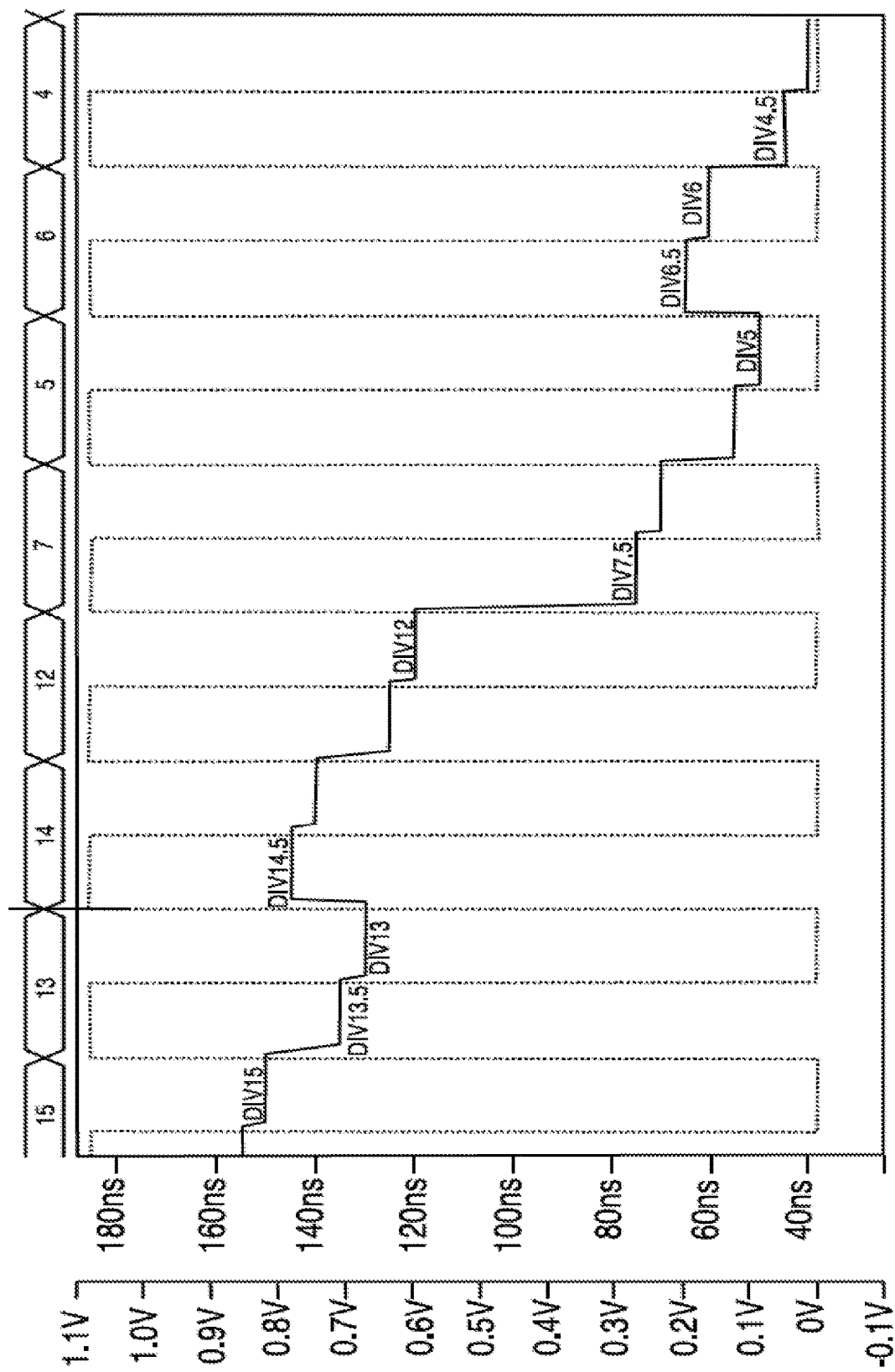
FIG. 5 is a graph illustrating how the programmable-on-the-fly fractional divider disclosed herein can fully change divisor value on a cycle-by-cycle basis.

From the descriptions given above, it is evident that the programmable-on-the-fly fractional divider 100 is capable of switching the divisor value NDIV<n:0>. As explained, new values of NDIVasync<n:1> may be loaded during each cycle. This can be seen in FIG. 5, where, for example, a divide by 13 is produced by the end of a current cycle which begins with the loading of a divisor of 13, or where a divide by 7 is produced by the end of a current cycle which begins with the loading of a divisor of 7.

From the principles and circuits described above, those of skill in the art will understand that the design of the programmable-on-the-fly fractional divider 100 can be extended to a design capable of division not just by N and N+0.5, but also capable of division by N+1/M, with M being the number of clock phases available. For example, if M is four to indicate that four clock phases are available, the programmable-on-the-fly fractional divider 100 can divide by N+0.25, N+0.50, N+0.75, and N.

The invention claimed is:
1. A divider circuit for producing an output clock signal from an input clock signal, comprising:
   a subtract-by-two circuit receiving most significant bits of an input divisor value and producing a subtracted-by-two output, the subtracted-by-two output being two less than the most significant bits of the input divisor value;
   a subtract-by-one circuit receiving the most significant bits of the input divisor value and producing a subtracted-by-one output, the subtracted-by-one output being one less than the most significant bits of the input divisor value;
   a first multiplexer passing a selected one of the subtracted-by-two output and the subtracted-by-one output in response to a first multiplexer control signal;
   a second multiplexer passing a selected one of an output of the first multiplexer and the most significant bits of the input divisor value in response to a second multiplexer control signal to thereby produce an asynchronous divider value;
an asynchronous one shot N+2 divider receiving the asynchronous divider value and the input clock signal, the asynchronous one shot N+2 divider configured to divide the input clock signal by the asynchronous divider value to produce a first divided signal;
an output flip flop receiving the first divided signal, the output flip flop being clocked by an inverse of the input clock signal to produce a second divided signal;
a third multiplexer passing a selected one of the first divided signal and the second divided signal in response to a select load signal to thereby produce a multiplexer output clock; and
a divider receiving the multiplexer output clock and dividing the multiplexer output clock by a set divisor to produce the output clock signal.

2. The divider circuit of claim 1, further comprising an input flip flop receiving the input divisor value and a fractional divide indicator, the input flip flop being clocked by an inverse of the output clock signal to latch the input divisor value and the fractional divide indicator.

3. The divider circuit of claim 1, wherein the set divisor is two; and wherein the divider is a divide by two divider that divides the multiplexer output clock by two to produce the output clock signal.

4. The divider circuit of claim 1, further comprising a first combinational logic circuit configured to generate the first multiplexer control signal based upon a least significant bit of the input divisor value, a fractional divide indicator, an inverse of the output clock signal, and the select load signal.

5. The divider circuit of claim 4, wherein the first combinational logic circuit is also configured to generate the second multiplexer control signal based upon the least significant bit of the input divisor value, the fractional divide indicator, the inverse of the output clock signal, and the select load signal.

6. The divider circuit of claim 5, further comprising:
a first inverter configured to receive the output clock signal and produce the inverse of the output clock signal; and
a second inverter configured to receive the inverse of the output clock signal and produce a reproduced version of the output clock signal; and
wherein the first combinational logic circuit comprises:
a third inverter receiving the least significant bit of the input divisor value and outputting an inverse of the least significant bit of the input divisor value;
a first NAND gate receiving the least significant bit of the input divisor value and the inverse of the output clock signal and producing a first NAND output;
a second NAND gate receiving the reproduced version of the output clock signal at an inverting input and receiving the select load signal and the fractional divide indicator at non-inverting inputs, the second NAND gate producing a second NAND output; and
a third NAND gate receiving the first and second NAND outputs and producing the first multiplexer control signal; and
a NOR gate receiving the inverse of the least significant bit of the input divisor value and the second NAND output and producing the second multiplexer control signal.

7. The divider circuit of claim 5, further comprising:
a first inverter configured to receive the output clock signal and produce the inverse of the output clock signal;
a second inverter configured to receive the inverse of the output clock signal and produce a reproduced version of the output clock signal; and
a second combinational logic circuit comprising:
an exclusive OR gate receiving the fractional divide indicator and an immediately prior version of the select load signal;
an AND gate receiving the inverse of the input clock signal, the first divided signal, and the second divided signal, and producing a clock phase select signal;
a first flip flop receiving the reproduced version of the output clock signal and being clocked by the clock phase select signal to produce a phase select signal; and
a second flip flop receiving output of the exclusive OR gate and being clocked by the phase select signal to produce the select load signal.

8. A method for producing an output clock signal from an input clock signal, comprising:
receiving most significant bits of an input divisor value and producing a subtracted-by-two output, the subtracted-by-two output being two less than the most significant bits of the input divisor value;
receiving the most significant bits of the input divisor value and producing a subtracted-by-one output, the subtracted-by-one output being one less than the most significant bits of the input divisor value;
passing a selected one of the subtracted-by-two output and the subtracted-by-one output from a first multiplexer in response to a first multiplexer control signal;
passing a selected one of an output of the first multiplexer and the most significant bits of the input divisor value in response to a second multiplexer control signal to thereby produce an asynchronous divider value;
dividing the input clock signal by the asynchronous divider value to produce a first divided signal;
producing a second divided signal from the first divided signal, in response to an inverse of the input clock signal; and
passing a selected one of the first divided signal and the second divided signal in response to a select load signal to thereby produce a multiplexer output clock.

9. The method of claim 8, further comprising generating the first multiplexer control signal based upon a least significant bit of the input divisor value, a fractional divide indicator, an inverse of the output clock signal, and the select load signal.

10. The method of claim 9, further comprising generating the second multiplexer control signal based upon the least significant bit of the input divisor value, the fractional divide indicator, the output clock signal, and the select load signal.

11. The method of claim 9, wherein generating the first multiplexer control signal is performed by:
performing a logical NAND operation on the least significant bit of the input divisor value and the inverse of the output clock signal to produce a first NAND output;
performing a logical NAND operation on an inverse of the output clock signal, the select load signal, and the fractional divide indicator to produce a second NAND output; and performing a logical NAND operation on the first and second NAND outputs to produce the first multiplexer control signal; and performing a logical NOR operation on an inverse of the least significant bit of the input divisor value and the second NAND output to produce the second multiplexer control signal.

12. The method of claim 10, wherein generating the second multiplexer control signal is performed by:

performing an exclusive OR operation on the fractional divide indicator and an immediately prior version of the select load signal;

performing a logical AND operation on the inverse of the input clock signal, the first divided signal, and the second divided signal to produce a clock phase select signal;

latching the output clock signal in response to the clock phase select signal to produce a phase select signal; and latching a result of the exclusive OR operation in response to the phase select signal to produce the select load signal.

13. The method of claim 8, further comprising latching the input divisor value and a fractional divide indicator in response to an inverse of the output clock signal.

14. The method of claim 8, further comprising dividing the multiplexer output clock by two to produce an output clock signal.

15. A divider circuit for producing an output clock signal from an input clock signal, comprising:

a first subtraction circuit receiving most significant bits of an input divisor value and producing a first subtracted output, the first subtracted output being two less than the most significant bits of the input divisor value;

a second subtraction circuit receiving the most significant bits of the input divisor value and producing a second subtracted output, the second subtracted output being one less than the most significant bits of the input divisor value;

a first multiplexer passing a selected one of the first subtracted output and the second subtracted output in response to a first multiplexer control signal;

a second multiplexer passing a selected one of an output of the first multiplexer and the most significant bits of the input divisor value in response to a second multiplexer control signal to thereby produce an asynchronous divider value;

an asynchronous divider receiving the asynchronous divider value and the input clock signal, the asynchronous divider configured to divide the input clock signal by the asynchronous divider value to produce a first divided signal;

an output flip flop receiving the first divided signal, the output flip flop being clocked by an inverse of the input clock signal to produce a second divided signal;

a third multiplexer passing a selected one of the first divided signal and the second divided signal in response to a select load signal to thereby produce a multiplexer output clock; and a divider receiving the multiplexer output clock and dividing the multiplexer output clock by a set divisor to produce the output clock signal.

16. The divider circuit of claim 15, further comprising an input flip flop receiving the input divisor value and a fractional divide indicator, the input flip flop being clocked by an inverse of the output clock signal to latch the input divisor value and the fractional divide indicator.

17. The divider circuit of claim 15, wherein the divider is a divide by two divider that divides the multiplexer output clock by two to produce the output clock signal.

18. The divider circuit of claim 15, further comprising a first combinational logic circuit configured to generate the first multiplexer control signal based upon a least significant bit of the input divisor value, a fractional divide indicator, an inverse of the output clock signal, and the select load signal.

19. The divider circuit of claim 18, wherein the first combinational logic circuit is also configured to generate the second multiplexer control signal based upon the least significant bit of the input divisor value, the fractional divide indicator, the inverse of the output clock signal, and the select load signal.

* * * * *